Figure 1:
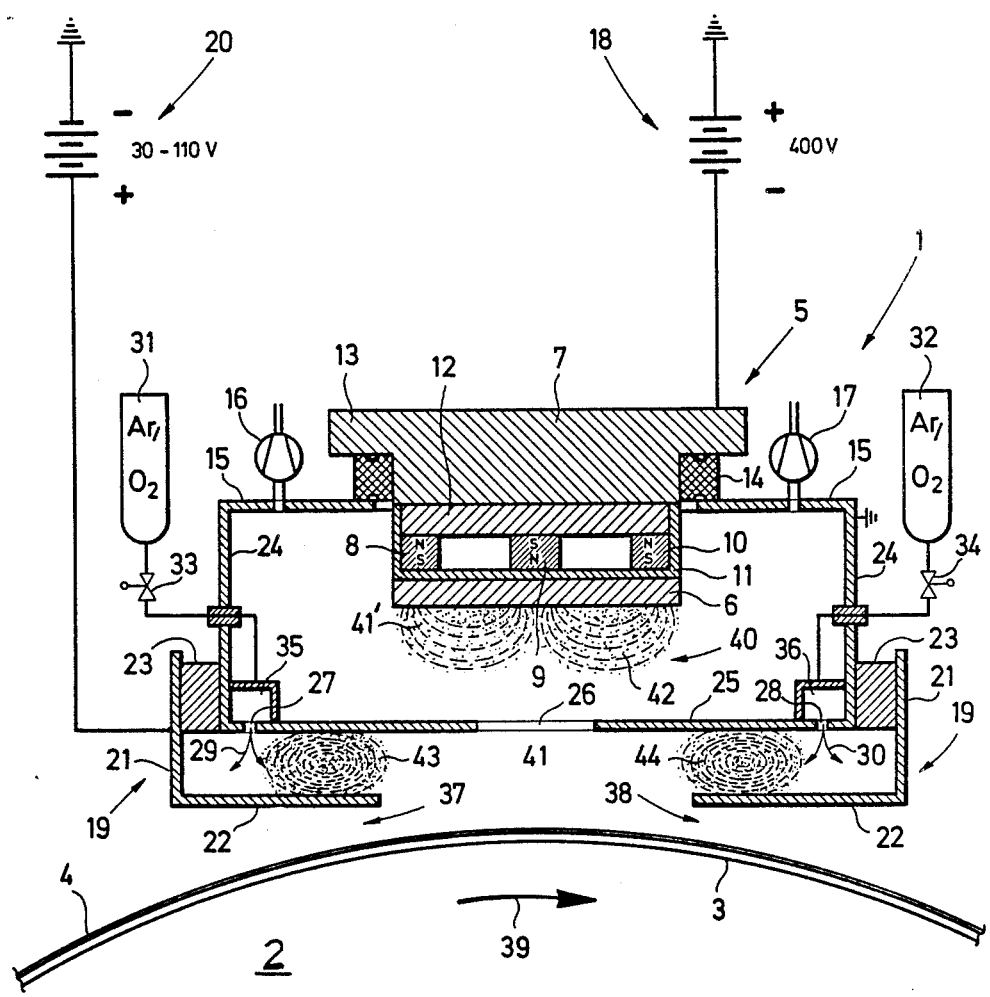

United States Patent [19]

Dietrich et al.

[11] Patent Number: 4,946,576

[45] Date of Patent: Aug. 7, 1990

[54] APPARATUS FOR THE APPLICATION OF THIN LAYERS TO A SUBSTRATE

[75] Inventors: Anton Dietrich, Rodenbach; Klaus Hartig, Ronneburg, both of Fed. Rep. of Germany

[73] Assignee: Leybold Aktiengesellschaft, Hanau, Fed. Rep. of Germany

[21] Appl. No.: 311,401

[22] Filed: Feb. 14, 1989

Related U.S. Application Data

[63] Continuation of Ser. No. 132,642, Dec. 7, 1987, abandoned, which is a continuation of Ser. No. 872,924, Jun. 11, 1986, abandoned.

[30] Foreign Application Priority Data

Jun. 12, 1985 [DE] Fed. Rep. of Germany ....... 3521053

[51] Int. Cl.⁵ .............................................. C23C 14/35
[52] U.S. Cl. ......................... 204/298.06; 204/192.12; 204/298.07; 204/298.08; 204/298.11; 204/298.14; 204/298.16; 204/298.19; 204/298.23; 204/298.24
[58] Field of Search ................ 204/164, 192.1, 192.12, 204/298 TT, 298 GF, 298 PS, 298 MS, 298 AN, 298 ME, 298 PM, 298 SC, 298 SM

[56] References Cited

U.S. PATENT DOCUMENTS

| | | | |
|---|---|---|---|
| 4,094,764 | 6/1978 | Boucher et al. | 204/298 |
| 4,169,031 | 9/1979 | Brors | 204/298 X |
| 4,218,495 | 8/1980 | Takagi et al. | 427/42 |
| 4,294,678 | 10/1981 | Kuehnle | 204/298 X |
| 4,392,931 | 7/1983 | Maniv et al. | 204/298 X |
| 4,395,323 | 7/1983 | Denton et al. | 204/298 X |
| 4,401,539 | 8/1983 | Abe et al. | 204/298 X |
| 4,428,812 | 1/1984 | Sproul | 204/192 |
| 4,447,305 | 5/1984 | Heindl et al. | 204/192 |
| 4,492,620 | 1/1985 | Matsuo et al. | 204/298 X |
| 4,572,842 | 2/1986 | Dietrich et al. | 204/298 X |

FOREIGN PATENT DOCUMENTS

| | | |
|---|---|---|
| 2616270 | 3/1977 | Fed. Rep. of Germany . |
| 138679 | 11/1979 | Fed. Rep. of Germany . |
| 142568 | 2/1980 | Fed. Rep. of Germany . |
| 3331707 | 3/1985 | Fed. Rep. of Germany . |

Primary Examiner—Nam X. Nguyen
Attorney, Agent, or Firm—Leydig, Voit & Mayer

[57] ABSTRACT

The invention concerns apparatus for the application of thin layers on a substrate by means of a cathode sputtering process. A mechanical shutter is provided between a cathode to be sputtered and an anode, which shutter divides the space between the cathode and the substrate to be coated. In addition, glow discharge means is provided both between the anode and the shutter.

7 Claims, 2 Drawing Sheets

APPARATUS FOR THE APPLICATION OF THIN LAYERS TO A SUBSTRATE

This is a continuation of copending application Ser. No. 132,642 filed on Dec. 7, 1987 which is a continuation of Ser. No. 872,924 filed on June 11, 1986, all abandoned.

The invention concerns apparatus for the application of thin layers to a substrate by means of a cathode sputtering process wherein a shutter is provided between the cathode to be sputtered and the anode, which shutter divides the space between the cathode and the substrate to be coated.

In numerous areas of technology it is required to apply very thin layers of pure substances to certain objects. Examples of this include window glasses which are provided with a thin metal or metal oxide layer in order to remove certain wave-length regions from sunlight. Also in semi-conductor technology frequently thin layers of a second substrate are applied to a first substrate. It is particularly important here that the thin layers should not only be very pure but should also be dosed or metered very accurately so that the actual layer thicknesses—in case of layers of chemical compounds, their composition—should be exactly reproducible. Generally these layer thicknesses lie between two and a few thousand nanometers.

Essentially three different processes are known for applying thin layers to foils, glasses and other substrates. In the first process the thin layer is applied by chemical or electrochemical deposition, while in the second process the layer is applied by evaporation in vacuum.

However, these two processes do not permit large surfaces to be provided with very thin layers with the uniformly required precision and reproducibility, as a consequence of which the third process, the so-called sputtering or cathode disintegration is used ever more frequently.

In this cathode sputtering process there are provided in a vacuum chamber, a gas discharge plasma, a substance to be sputtered on a cathode which is also called a target and a substrate to be coated.

By means of the ions of a glow discharge plasma which collide with the cathode substrate to be sputtered, atoms from the target are freed and are deposited on the substrate to be coated. The glow discharge is effected by an electric field produced by a voltage of about 100 volts between the anode and the cathode, wherein in many cases the anode is formed by the metallic wall of a vaccum vessel. Since the cathode is effectively disintegrated by the ions which crash into it with high energy, the material of the cathode is removed in an atomic form and diffuses as a gas from the cathode in order to precipitate on the solid surfaces in the vicinity of the cathode in the form of coatings which adhere strongly and the thickness of which increases proportionally with the duration of sputtering.

It has been shown that pure metals or doped, electrically conducting semi-conductors are significantly more suitable as cathode sputtering material than e.g. their oxides. Thus for instance a cathode consisting of silicon dioxide can only be sputtered with high frequency and even then only at a low rate, while the sputtering doped silicon is possible even with direct voltage at a high rate. In addition, due to the technical expenses, the application of dielectric layers by means of high frequency sputtering of corresponding materials is economic only for substrate surfaces which are smaller than 1 $m^2$. When thin layers of metal oxides are to be applied to a substrate, then metal atoms are knocked out from the metallic cathode by means of the cathode sputtering process. Then these atoms are oxidised and precipitate on the substrate. Two different gases are required for carrying out such a process: a first, inert gas, e.g. argon, which is required for the production of the glow discharge plasma and a second, reactive gas, e.g. oxygen, which forms an oxide with the metal or semi-conductor atoms.

A process is already known for producing a layer which is difficult to oxidise on a body made from a readily oxidisable metal or a corresponding metal alloy, wherein the readily oxidisable body is substantially freed from its oxide "skin" by annealing under vacuum and is then without interruption provided with a protective layer which is difficult to oxidise in vacuum (DE-AS 26 26 270). In this process it is disadvantageous that a costly etching process must be carried out before the sputtering of the material which is not readily oxidisable.

Furthermore, apparatus is known for the reactive coating with a plasmatron, which is preferably used for the application of layers of chemical compounds such as oxides or carbides, (DD-PS 142 568). In order to increase the degree of reaction and the condensation rate in this apparatus, the vicinity of the cathode is placed at a slightly negative potential, whereby the slow electrons yielded from the discharge are deflected onto the grounded (earthed) and thus positive substrate. However, this process is not usable where the substrate is not conductive. Furthermore, after a short time the auxiliary electrode becomes covered with a non-conductive layer which reduces the effect.

Apparatus is also known for the reactive sputtering of compounds of metals and semi-conductors, in which a noble gas and a reaction gas for the formation of the desired compound with the target material are separately introduced into a chamber or space disposed between a magnetron cathode with a target and a substrate (DE-OS 33 31 707). In this process, in order to maintain the sputtering stable for a long time, a flow throttling between the target and the substrate is effected by means of a shutter. This known apparatus enables very precise and uniform thin layers, even of large surface area, to be applied to foils and the like. However, in this apparatus it is necessary, especially for very reactive target materials, to provide a very strong throttling of the flow by means of the shutter between the target and the substrate in order to keep the reactive gas away from the cathode, whereby a large part of the target atoms which have been knocked out do not arrive at the substrate and whereby these atoms do not contribute to the growth of the layer on the substrate. If the shutter opening is larger, then oxides collect on the cathode which form by a reaction of the knocked-out target atoms with the atoms of the reaction gas. Through the deposition of this oxide on the target the knocking-out of further atoms by means of the ions of the inert gas is rendered more difficult so that gradually the coating process deteriorates. Furthermore, the known apparatus is prone to overheating and the insulated suspended anode becomes coated with insulating material.

Further, an arrangement with an atom or molecular beam source is known which serves for coating a substrate according to the principle of sputtering solid materials by ionic bombardment (DD-PS 138 679). Here a target is sputtered at a higher discharge pressure in a chamber separated from the substrate space, the opening between the target and the substrate space functioning as a pressure stage. However, this arrangement is not suitable for reactive sputtering, because for that a reaction with the reactive gas at the target must be prevented, which requires a lower and not a higher partial pressure at the target.

Furthermore, a solid body component of the Schottky barrier type as well as a process for making it are known from U.S. Pat. No. 4 218 495. Here a metallic layer is provided with a semi-conducting layer, wherein the metallic layer consists of a metal which can form a Schottky barrier between this metal layer and the semiconductor layer. A connecting electrode on the semiconducting side, which is connected with the outer surface of the semi-conductor film, is so connected that it produces ohmic contact. At least the semi-conductor layer is applied by means of a so-called ionised-cluster beam deposition process. In this process one is concerned with a special form of evaporation with a condensation of a vapour beam to droplets which are then accelerated in a directed manner and thus permit the adjustment of the form of the growth of the layer. However, this process is not suited for reactive sputtering because neither do glow discharges arise nor are mixtures of reactive and inert gases supplied.

Further, a process for producing luminescent glass layers are known which operates with cathode sputtering, wherein the target contains silicon and at least one chemical compound which provides luminescence centres, e.g. cerium oxide, (U.S. Pat. No. 4 447 308). Between the target and a carrier a plasma with argon ions is formed, more particularly between two screens. Thus here only a single plasma is provided.

Finally, another apparatus for cathode sputtering with a high deposition rate is known wherein the deposition is applied to a substrate which is disposed within an evacuated or pumped housing and in which a target is at a negative potential relative to the anode (U.S. Pat. No. 4 074 764). Here a gas is brought at a pressure P into the space between the target and the anode. A high gas pressure gradient arises between the target and the substrate. In addition, a magnetic field is produced in a direction parallel to the target surface, which field lies opposite the surface so that a screening around the target is provided. The high deposition rate results inter alia from the fact that the pressure of the gas in the immediate vicinity of the target is very high but in the vicinity of the substrate it is very low, whereby the plasma has a very low capacity of absorption for the sputtered particles. However, a reduction of the portion of reactive gas directly in front of the target in order to increase the rate is not possible with this apparatus. In other respects, as with the apparatus according to DE-OS 3 331 707, this apparatus also fails to have a shutter between the target and the anode.

Accordingly, the invention has the task of improving the cathode sputtering process in such a manner that over longer periods accurate coatings with higher utilisation efficiency of the target material are rendered possible.

This task is solved in that a first glow discharge is provided between the cathode to be sputtered and the shutter and a second glow discharge separated from the first is provided between the shutter and the anode.

The advantage achieved by the invention consists particularly in that a separated supply of two different gases, the reaction gas and the inert gas, is not necessary and, despite that, an extraordinarily good application of thin layers is possible. While in the known apparatus pressures of the order of magnitude of $1-2 \times 10^{-2}$ mB prevail, in the apparatus according to the invention, the pressures are only $2 \times 10^{-3}$ mB. A lower pressure means, however, lower contamination and thus more pure evaporation substances. In addition to the better quality of the layer, the invention also results in a higher rate of layer growth for dielectric layers in comparison with the known processes as well as a better controllability of the composition of the layers formed by a chemical reaction of the target material with an introduced reactive gas. In the known apparatus for the reactive sputtering of compounds in most cases it is the chemical reaction rate which is the limiting process for the rate of layer growth. By means of the arrangement according to the invention of an additional glow discharge directly in front of the substrate, which can be controlled in its intensity via the potential at the anode device independently of the glow discharge of the sputtering process at the cathode, a significant improvement is achieved. Since the reactive gas is introduced into this space of the glow discharge in front of the substrate and the chemical reactiveness of the gas may be enhanced by ionisation in this glow discharge, the chemical reaction rate for the formation of the compound at the substrate surface is increased and thereby so also is the rate of layer growth.

Furthermore, in certain cases it is necessary very accurately to control the composition or stoichiometry of the applied layers in order to achieve the desired layer properties. An example for this is the application of transparent, electrically conductive layers made from a compound of indium oxide and tin oxide. In these layers the electrical conductivity is very sensitively dependent on the oxygen content of these layers. With the apparatus according to the invention it is possible to control the composition of the layer in the required manner by controlling the glow discharge in front of the substrate so that even plastic foils of up to 2 m width can be coated with layers of these compounds at a high rate and a good quality.

A further advantage of the invention consists in that an improvement is achieved not only by coating with compounds but also by coating with pure metallic layers on a moving substrate, compared to known arrangements. The additional plasma at the substrate surface leads to an intensive electron and ion bombardment of a moving substrate directly before it arrives in the coating zone. This results in a removal of sputtering of loosely bound particles at the substrate surface which would otherwise worsen the adhesion of the applied layer. This is valid particularly also for the case where pure metals or semi-conductor layers are applied, and therefore only one reactive gas is introduced.

Figure 2:
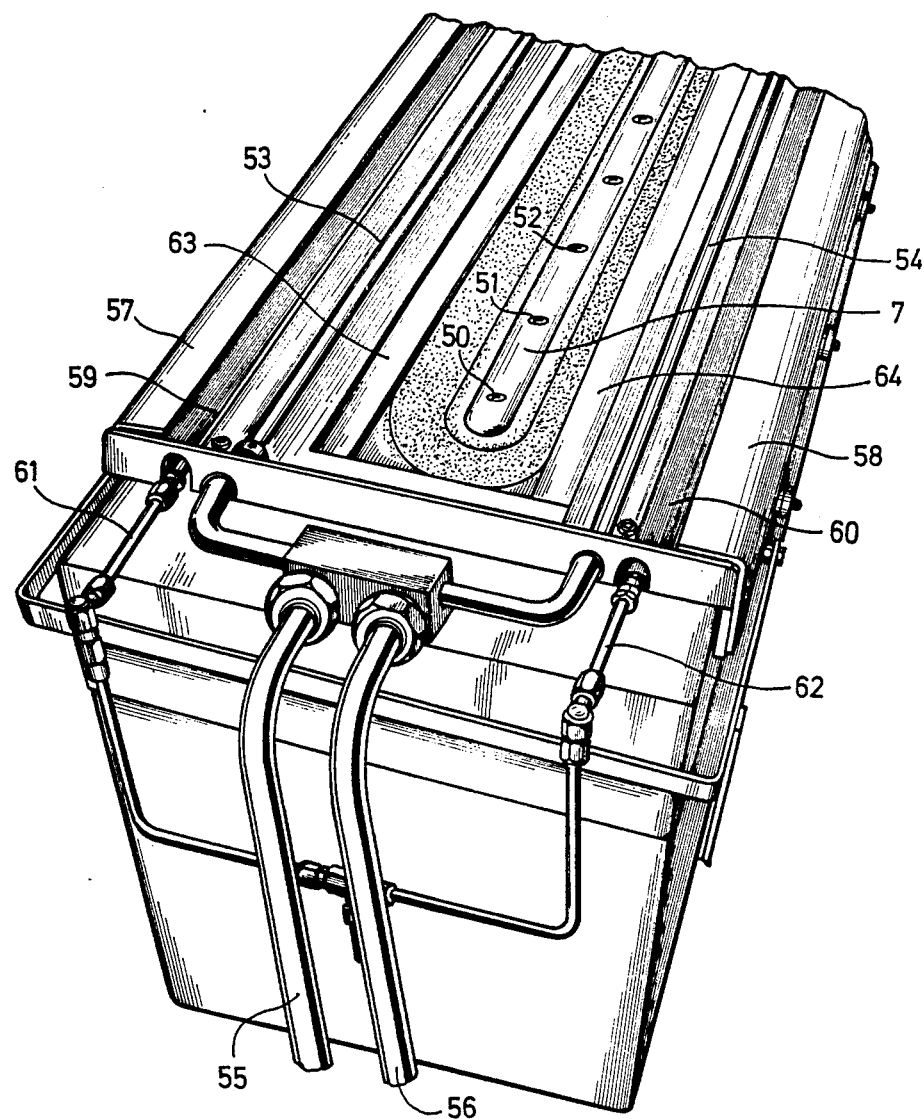

A preferred embodiment of the invention is illustrated in the drawings and will be described in greater detail below. In the drawings:

FIG. 1 is a representation of the principle of the invention showing a cathode sputtering apparatus in cooperation with a foil guided over a drum in order to be coated; and FIG. 2 is a detailed view of an actual form of the cathode sputtering apparatus according to the invention.

In FIG. 1 there is illustrated a cathode sputtering apparatus 1 arranged opposite a drum 2 on the surface 3 of which is disposed a thin foil which is to be coated with an oxide, for instance $Al_2O_3$. The cathode sputtering apparatus 1 has a cathode device 5 which in its turn has the actual sputtering cathode 6 and a cathode mounting. Between the sputtering cathode 6, which consists e.g. of pure aluminum and the cathode mounting 7 permanent magnets 8, 9, 10 are provided which rest on a hollow body 11 and are closed by a common yoke 12. The rim of the hollow body 11 is connected in a gas-tight and liquid-tight manner with the cathode mounting 7. A coolant liquid, e.g. water, is circulated in the hollow body 7 in direct or indirect contact with the target 6. The target or sputtering cathode 6 is arranged at the front side of the hollow body 11 and is in electrical and good heat-conductive connection with the cathode mounting 7.

The cathode mounting 7 has a flange-like edge 13 which is connected with the intermediation of an insulator 14 with the cover 15 of a cathode chamber 40. Also, one or more pumps, preferably, two pumps 16, 17, of large suction cross-section are connected with this cover 15 which constantly evacuates the cathode chamber 40. The cathode mounting 7 is electrically connected with the negative pole of a source 18 of direct voltage which delivers a direct voltage of about 400 volts. An anode device 19 is associated with the cathode device 5 and is connected to the positive pole of a source 20 of direct voltage which delivers a direct voltage of approximately 30 volts to 100 volts. The anode device 19 has two mutually perpendicular shanks 21, 22 in which one shank 21 is connected via an insulator 23 with one sidewall 24 of the cathode chamber. Between the anode device 19 and the cathode device 5 a shutter 25 with a central opening 26 is arranged, which additionally has at least two lateral openings 27 and 28 through which gas may flow, as indicated by double arrows 29, 30. The gas required for this comes from gas sources 31, 32 and is supplied over regulating valves 33, 34 to respective anti-chambers 35, 36 disposed on the upper side of the shutter 25. As the gas e.g. a mixture of argon and oxygen may be used.

In practice the pumps are not only in communication with the chamber 40, but also with the whole ambience of the apparatus, that is to say via the gaps 37, 38 with the chamber 41. However, here the gaps 37, 38 are kept as narrow as is mechanically and electrically possible, i.e. the cross-section of the opening formed by gaps 37, 38 amounts at most to about 20% of the cross-section of the opening in chamber 40 to the pumps, in order to keep the gas flow to the pumps via the gaps 37, 38 small. In this way the introduced reactive gas mixture, which is additionally activated by the gas discharge 43, 44, is concentrated in front of the substrate 4 in order to accelerate the formation of the desired chemical combination of the target material with the reaction gas on the substrate. In contrast to that, the cathode chamber 40 is connected with the pumps 16, 17 via large opening cross-sections in order to pump away the reactive components of the gases flowing into the chamber 40 via the opening 26 as quickly as possible. This serves to accommodate the formation of a chemical reaction of the reactive gas with the target surface 6, especially for the case where this compound is electrically non-conductive and would thus terminate the direct voltage sputtering process after a short time. This is also a significant difference in relation to the hitherto known apparatuses, (e.g. U.S. Pat. No. 4 204 942, U.S. Pat. No. 4 298 444), since there the introduced gas mixture not used up in the growth of the layer can be removed exclusively over the gaps, which gaps are formed by the substrate and the mechanical shutter lying directly opposite the substrate analogously to the gaps 37, 38 of the present apparatus.

A multiple coating is also possible with the invention wherein however cover sheets are provided between the individual devices which are arranged around the drum 3, because the gaps 37, 38 are wider than those in the apparatuses according to U.S. Pat. No. 4 204 942 and 4 298 444. The relative direction of movement of the drum 2 is indicated by an arrow 39; it may, however, also run in the opposite direction.

When the gas is introduced and the electrical direct voltage is applied to the cathode device 5 and the anode device 19, then two plasma zones are formed in chambers 40, 41, of which in FIG. 1 respectively two regions 41, 42 and 43, 44 may be seen.

The additional plasma 43, 44 at the substrate surface leads to an intensive electron and ion bombardment of a moving substrate directly before it arrives into the coating zone. This leads to a removal and sputtering of loosely bound particles at the substrate surface which would otherwise worsen the adhesion of the applied layer. This is valid particularly also for the case where pure metallic or semi-conductor layers are to be applied, and therefore only reactive gas is introduced.

The per se known arrangement of permanent magnets 8, 9, 10 is not significant for the principle of the invention, since these permanent magnets 8, 9, 10 are only charged with the task of concentrating the plasma 41', 42 in the front region of the sputtering cathode 6. The plasma formation at two different locations of the cathode chamber results from the fact that between the anode device 19 and the cathode device 5 an electric field arises because of the potential coming from the voltage sources 18, 20 and a shutter 25 is inserted into this field.

Although the shutter 25 between the anode device 19 and the cathode device 5 influences the electric field, nevertheless the potentials of the voltage sources 18, 20 are so arranged that the actually existing field strength in front of the sputtering cathode 6 is sufficient to cause a glow discharge which in its turn is the cause of the knocking-out of atoms from the sputtering cathode 6. Viewed electrically, the shutter 25 thus has a function similar to that of a control grid of a discharge tube. However, the shutter 25 differs from such a control grid in that it forms in its outer regions a complete barrier for the gaseous atoms and molecules while in its central region 26 it permits the atoms and molecules to pass through unhindered.

The shutter 25 is connected to ground (earth) and is thus biased negatively relatively to the anode device 19. The current intensity flowing through the anode device 19—and thus the degree of ionisation of the gas in the chamber 41—may be adjusted by the current course 20 at the anode device 19. Here the fact is exploited that in the region of the cathode plasma many free charge carriers exist, especially negatively charged electrons, which as a consequence of the positive potential at the anode device 19 are accelerated through the shank opening 26 to the shutter 22. The gas particles introduced into this chamber are ionised through collisions with the electrons. The anode device 19 is so arranged that it is electrically screened by the shutter (25) so that without the application of a positive potential only a very low current flows through the anode device 19, amounting to only a few percent of the cathode current. This assures that a sufficiently large acceleration path is available for the electrons in order to produce a plasma 43, 44 separated from the cathode plasma 41', 42 and to produce by ionisation through collisions additional charge carriers. Without a positive potential or with a low positive potential at the anode device 19 the electrons produced by the cathode plasma are led back to the voltage source 20 via the grounded (earthed) shutter 25. Also, in this case one cannot observe a glowing plasma in the chamber 41 in front of the substrate. For operation a current is set over the anode device 19 which amounts to between 50% and 100% of the current flowing through the cathode. The potentials required for this purpose at the anode device 19 are in the range of approximately $+30$ volt to $+100$ volt.

As already mentioned, by means of the glow discharge in the chamber directly in front of the foil 4 to be coated, the inflowing gas mixture of Ar and $O_2$ is ionised. The ionised oxygen forms a chemical compound with the aluminum coming from the sputtering cathode 6 and precipitates as $Al_2O_3$ on the thin foil 4. The oxygen mixture is thus already extensively removed before it appears, via the opening 26, on the sputtering cathode 6.

In order to prevent the oxygen, that did not form a chemical compound with the aluminum, from arriving at the sputtering cathode and from forming an oxide there, which would worsen the sputtering process, the gas is continuously pumped away from the sputtering cathode 6 by the pumps 16, 17.

Each of the described individual measures—introduction of the gas mixture into a preceding additional discharge space and the removal by suction of the gas from the sputtering cathode 6—brings with it, taking each by itself, a significant technical advance. This advance is all the greater when both measures are brought into utilisation together.

In FIG. 2 there is shown a technical realisation of the apparatus illustrated in FIG. 1 in principle. The mounting 7 for the sputtering cathode 6, which cathode itself is not shown, may be seen here. This sputtering cathode 6 may be secured by means of screws in threaded bores 50, 51, 52. Coolant pipes 53, 54 run next to the mounting 7 and constitute a continuation of coolant pipes 55, 56. The space for the additional glow discharge is formed by the webs 57 and 58 and 59 and 60. Gas flows into this space or chamber via gas-conveying pipes 61, 62. The shutter separating the two glow discharge spaces from each other is designated by the reference numbers 63, 64.

The slits for applying suction are not shown in FIG. 2. However, they are disposed on the side surfaces, thus e.g. beneath the reference number 58. The whole of the apparatus shown in FIG. 2 is accommodated—in given cases with a plurality of similar apparatuses—in a vacuum chamber evacuated by pumps. The evacuation of the apparatus thus takes place through the non-visible slits e.g. beneath the reference number 58, and by means of pumps arranged in the housing which surrounds the apparatus illustrated in FIG. 2. When there are a plurality of apparatuses of the type shown in FIG. 2 provided in the mentioned housing, which is evacuated, then between these, or between groups of such apparatuses, there may be respectively at least one sealing plate. Such sealing plates may extend somewhat parallel to the rearwardly extending side surfaces of the apparatus shown in FIG. 2 and thus perpendicularly to the surface of the drum 3 which must be imagined as being above the cathode mounting.

As an alterative to providing a number of sputtering apparatuses within a housing, individual apparatuses, together with the substrate to be coated may be disposed within separate housings and pumping means may be provided in each to remove gasses through gaps provided in the housing. Such housing may, for instance, be formed by the sidewall 24 and cover 15 as shown in FIG. 1.

When a plurality of cathode sputtering devices are located within a single housing, they are typically separated from each other by separating plates arranged preferably perpendicularly to tangents to the drum. In such cases where there are a plurality of n apparatuses arranged around a drum, they may be separated or divided by separating plates or blocks into m groups in which each group is associated with its own pumping means or device. In such case, each pumping device consists of at least two pumps which are arranged at different positions along the longitudinal axis of a cathode sputtering apparatus.

The drum of the present invention may also form part of a multi-part conveying device.

The present invention may also include a gas distributing device located between the anode device 19 and the shutter device 25 which uses the antichambers 35,36 to distribute an inert gas or a mixture of an inert and a reactive gas in a uniform manner.

We claim:

1. A sputtering apparatus for application of thin layers on a substrate comprising:
   a cathode adapted to be sputtered;
   a substrate to be coated;
   an anode having an opening of a first size located adjacent said substrate and forming a first shutter;
   a second shutter between said cathode and said anode, said second shutter dividing the space between said cathode and said substrate into a first region located between said cathode and said second shutter and a second region located between said anode and said second shutter, wherein only said second region is adapted to receive a reactive gas, said second shutter having an opening of a second size, smaller than said anode opening;
   first means for generating a first glow discharge located in said first region;
   second means for generating a second glow discharge located in said second region separated and independent from said first glow discharge by said second shutter; and
   exhaust means connected to said first region and coupled through said second shutter to said second region for exhausting gases therefrom.

2. A sputtering apparatus as set forth in claim 1 including an inlet for the reactive gas comprising a space formed by the anode and the second shutter which is open in the direction of the substrate, the inlet being located so that the second glow discharge is arranged between the inlet and the substrate.

3. A sputtering apparatus as set forth in claim 1 wherein the cathode is connected to a potential of about $-400$ volts, the anode is connected to a potential of about $+30$ to $100$ volts and the second shutter is connected to a common ground.

4. A sputtering apparatus as set forth in claim 1 including a narrow gap defined by a physical space between the first shutter and the substrate whose cross-sectional area is no greater than approximately 20 percent of the cross-sectional area of an opening associated with the exhaust means for exhausting gas from the first and second regions.

5. A sputtering apparatus as set forth in claim 1 disposed within a housing with other sputtering apparatus and separated from the other sputtering apparatus by plates.

6. A sputtering apparatus as set forth in claim 5 wherein the plates are arranged perpendicularly to the tangents of a drum supporting the substrate.

7. A sputtering apparatus as set forth in claim 6 wherein the drum is part of a multi-part conveying device for the substrate.

* * * * *